US010241183B2

(12) United States Patent
Umeda

(10) Patent No.: US 10,241,183 B2
(45) Date of Patent: Mar. 26, 2019

(54) MAGNETIC RESONANCE IMAGING APPARATUS AND METHOD THEREOF

(71) Applicant: Toshiba Medical Systems Corporation, Otawara-shi (JP)

(72) Inventor: Masaaki Umeda, Sakura (JP)

(73) Assignee: Toshiba Medical Systems Corporation, Otawara-shi (JP)

( * ) Notice: Subject to any disclaimer, the term of this patent is extended or adjusted under 35 U.S.C. 154(b) by 182 days.

(21) Appl. No.: 15/168,913

(22) Filed: May 31, 2016

(65) Prior Publication Data

US 2016/0363643 A1 Dec. 15, 2016

(30) Foreign Application Priority Data

Jun. 9, 2015 (JP) ................. 2015-116810

(51) Int. Cl.
*G01V 3/00* (2006.01)
*G01R 33/565* (2006.01)
(Continued)

(52) U.S. Cl.
CPC ......... *G01R 33/565* (2013.01); *G01R 33/482* (2013.01); *G01R 33/483* (2013.01);
(Continued)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/50
USPC ................................................ 324/300–322
See application file for complete search history.

(56) References Cited

U.S. PATENT DOCUMENTS

| 6,008,647 A | 12/1999 | Zhou et al. |
| 2005/0001616 A1* | 1/2005 | Jenniskens ......... G01R 33/5615 324/307 |

(Continued)

FOREIGN PATENT DOCUMENTS

| JP | 08-322817 | 12/1996 |
| JP | 2011-182916 | 9/2011 |

(Continued)

OTHER PUBLICATIONS

Office Action dated Jan. 15, 2019, in corresponding Japanese Patent Application No. 2015-116810.

*Primary Examiner* — Giovanni Astacio-Oquendo
*Assistant Examiner* — Raul Rios Russo
(74) *Attorney, Agent, or Firm* — Oblon, McClelland, Maier & Neustadt, L.L.P.

(57) ABSTRACT

A magnetic resonance imaging apparatus according to an embodiment includes a calculation unit, a collecting unit, and an execution unit. The calculation unit calculates, based on a pulse sequence used in data collection by fast spin echo method, a phase shift amount on at least one echo component included in each of a plurality of echo signals. The correcting unit corrects, based on the calculated phase shift amount, phases of refocusing pulses applied in the pulse sequence such that phases match at least one of between spin echo components, between stimulated echo components, and between a spin echo component and a stimulated echo component. The execution unit executes the pulse sequence in which the refocusing pulses of the corrected phases are applied.

20 Claims, 8 Drawing Sheets

(51) Int. Cl.
  *G01R 33/48*  (2006.01)
  *G01R 33/483*  (2006.01)
  *G01R 33/561*  (2006.01)

(52) U.S. Cl.
  CPC ..... *G01R 33/4816* (2013.01); *G01R 33/4818* (2013.01); *G01R 33/4822* (2013.01); *G01R 33/4824* (2013.01); *G01R 33/4826* (2013.01); *G01R 33/4828* (2013.01); *G01R 33/5617* (2013.01); *G01R 33/56518* (2013.01); *G01R 33/56581* (2013.01)

(56) References Cited

U.S. PATENT DOCUMENTS

| | | | |
|---|---|---|---|
| 2011/0181282 A1* | 7/2011 | Dannels | G01R 33/5617 324/309 |
| 2011/0291651 A1* | 12/2011 | Umeda | G01R 33/5617 324/307 |
| 2011/0291653 A1* | 12/2011 | Umeda | G01R 33/5617 324/309 |
| 2012/0249143 A1* | 10/2012 | Umeda | G01R 33/56518 324/309 |
| 2012/0271584 A1* | 10/2012 | Xu | G01R 33/56518 702/106 |
| 2014/0210471 A1 | 7/2014 | Stemmer | |
| 2014/0347052 A1 | 11/2014 | Kamata et al. | |

FOREIGN PATENT DOCUMENTS

| | | |
|---|---|---|
| JP | 2012-213608 A | 11/2012 |
| JP | 2014-83388 | 5/2014 |
| JP | 2014-147756 | 8/2014 |

\* cited by examiner

FIG.5

| Ch | Mp |
|---|---|
| x | 1.5° |
| y | 1.2° |
| z | 0.9° |

FIG.6

| Ch | τ | B0p |
|---|---|---|
| x | 100 ms | 30° |
| x | 30 ms | 10° |
| y | 200 ms | 5° |
| z | 300 ms | 20° |

MAGNETIC RESONANCE IMAGING APPARATUS AND METHOD THEREOF

CROSS-REFERENCE TO RELATED APPLICATIONS

This application is based upon and claims the benefit of priority from Japanese Patent Application No. 2015-116810, filed on Jun. 9, 2015; the entire contents of which are incorporated herein by reference.

FIELD

Embodiments described herein relate generally to a magnetic resonance imaging apparatus and a method thereof.

BACKGROUND

Conventionally, as an imaging method concerning a magnetic resonance imaging apparatus, fast spin echo (FSE) method has been known. The FSE method is an imaging method that collects a plurality of echo signals referred to as an echo train by applying a plurality of refocusing pulses in sequence after having applied an excitation pulse to a subject.

BRIEF DESCRIPTION OF THE DRAWINGS

FIG. 5 is a table illustrating one example of a look-up table of phase shift amount stored in memory circuitry in the first embodiment;

FIG. 6 is a table illustrating one example of a look-up table of phase shift amount stored in the memory circuitry in the first embodiment;

DETAILED DESCRIPTION

A magnetic resonance imaging (MRI) apparatus according to an embodiment includes a calculation unit, a collecting unit, and an execution unit. The calculation unit calculates, based on a pulse sequence used in data collection by fast spin echo method, a phase shift amount on at least one echo component included in each of a plurality of echo signals. The correcting unit corrects, based on the calculated phase shift amount, phases of refocusing pulses applied in the pulse sequence such that phases match at least one of between spin echo components, between stimulated echo components, and between a spin echo component and a stimulated echo component.

The execution unit executes the pulse sequence in which the refocusing pulses of the corrected phases are applied.

With reference to the accompanying drawings, the following describes in detail exemplary embodiments of the MRI apparatus.

First Embodiment

Figure 1:
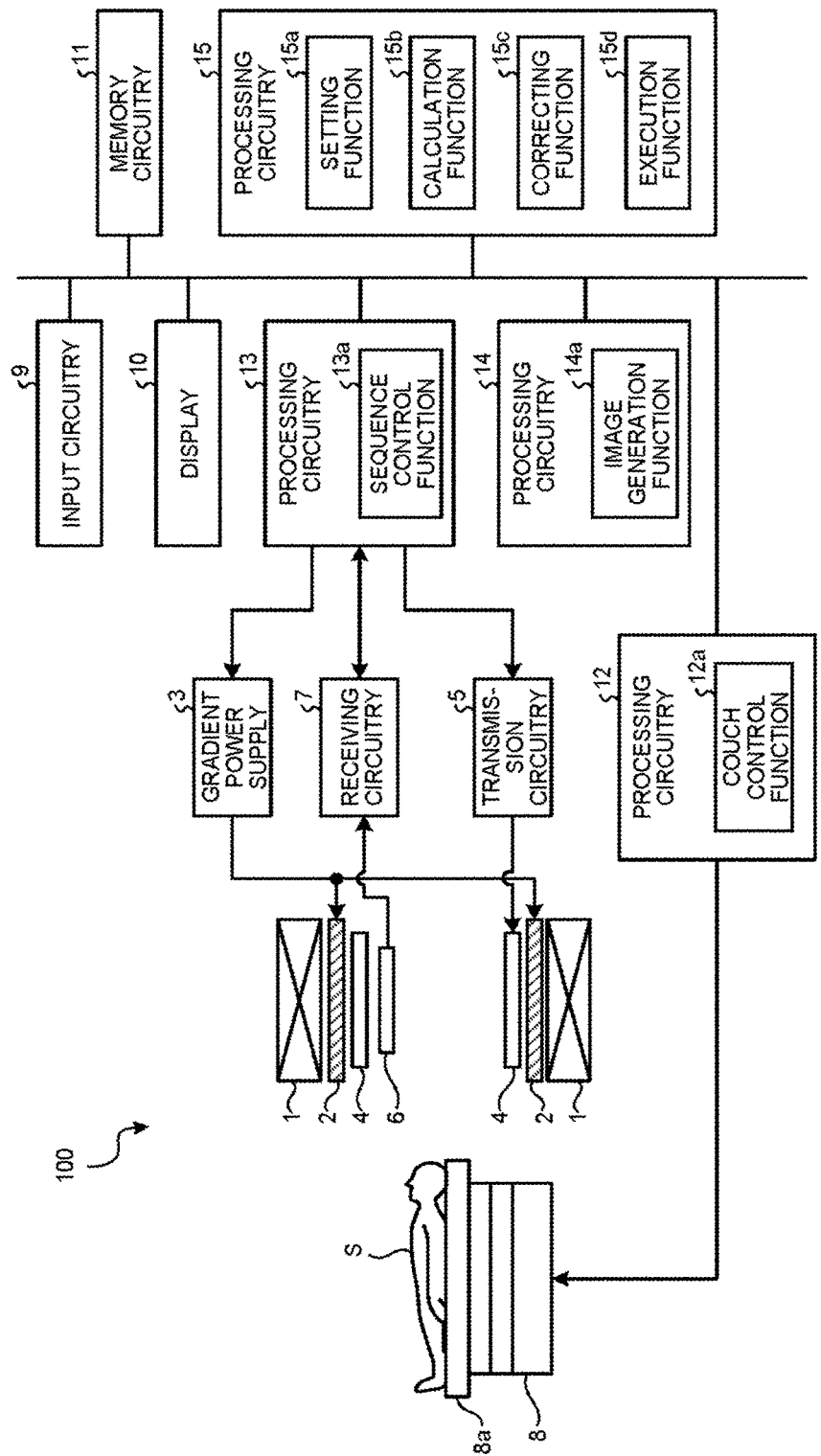
FIG. 1 is a block diagram illustrating a configuration example of an MRI apparatus according to a first embodiment.

FIG. 1 is a block diagram illustrating a configuration example of an MRI apparatus according to a first embodiment. For example, as illustrated in FIG. 1, an MRI apparatus 100 includes a static magnet 1, a gradient coil 2, a gradient power supply 3, a transmitting coil 4, transmission circuitry 5, a receiving coil 6, receiving circuitry 7, a couch 8, input circuitry 9, a display 10, memory circuitry 11, and processing circuitries 12 to 15.

The static field magnet 1 is formed in a substantially cylindrical hollow shape (including the one for which the cross-section orthogonal to the central axis of the cylinder is in an elliptical shape), and generates a uniform static magnetic field in an imaging space formed on the inner circumferential side. For example, the static magnet 1 is implemented with permanent magnets and superconducting magnets.

The gradient coil 2 is formed in a substantially cylindrical hollow shape (including the one for which the cross-section orthogonal to the central axis of the cylinder is in an elliptical shape), and is disposed on the inner circumferential side of the static field magnet 1. The gradient coil 2 has three coils that generate gradient magnetic fields along an x axis, along a y axis, and along a z axis that are the coordinate axes constituting device coordinates of the MRI apparatus 100 and are orthogonal to one another. For example, the direction of the x axis is defined in the vertical direction, and the direction of the y axis is defined in the horizontal direction. The direction of the z axis is defined in the same direction as the direction of magnetic flux of the static magnetic field generated by the static magnet 1.

The gradient power supply 3 individually supplies current to the respective three coils that the gradient coil 2 has, and thereby generates the gradient magnetic fields along the x axis, the y axis, and the z axis in the imaging space, respectively. By generating the gradient magnetic fields along the x axis, the y axis, and the z axis as appropriate, the gradient magnetic fields can be generated along a read-out direction, a phase encoding direction, and a slice direction, respectively, which are orthogonal to one another. In the following description, the gradient magnetic field that lies along the read-out direction is referred to as a read-out gradient magnetic field, the gradient magnetic field that lies along the phase encoding direction is referred to as a phase-encoding gradient magnetic field, and the gradient magnetic field that lies along the slice direction is referred to as a slice gradient magnetic field.

The respective gradient magnetic fields are superposed on the static magnetic field generated by the static magnet 1, and are used to give spatial positional information to magnetic resonance (MR) signals. Specifically, the read-out gradient magnetic field gives to an MR signal the positional information along the read-out direction by changing the frequency of the MR signal depending on the position in the read-out direction. The phase-encoding gradient magnetic field gives to an MR signal the positional information in the phase encoding direction by varying the phase of the MR signal along the phase encoding direction. The slice gradient magnetic field is used, when an imaging area is a slice region, to determine the direction, the thickness, and the number of slices of the slice region and, when the imaging area is a volume region, gives to an MR signal the positional information along the slice direction by varying the phase of the MR signal depending on the position in the slice direction.

The transmitting coil 4 is formed in a substantially cylindrical hollow shape (including the one for which the cross-section orthogonal to the central axis of the cylinder is in an elliptical shape), and is disposed on the inner side of the gradient coil 2. The transmitting coil 4 applies, to the imaging space, radio frequency (RF) pulses supplied from the transmission circuitry 5.

The transmission circuitry 5 supplies the RF pulses corresponding to a Larmor frequency to the transmitting coil 4.

The receiving coil 6 is attached to a subject S placed in the imaging space, and receives the MR signals (echo signals and others) emitted from the subject S by the influence of an RF magnetic field applied by the transmitting coil 4. The receiving coil 6 outputs the received MR signals to the receiving circuitry 7. For example, as for the receiving coil 6, a dedicated coil is used for each region of an imaging subject. The dedicated coil here is a receiving coil for head, a receiving coil for spine, and a receiving coil for abdomen, for example.

The receiving circuitry 7 generates MR signal data based on the MR signals received by the receiving coil 6. Specifically, the receiving circuitry 7 generates the MR signal data by performing digital conversion on the MR signals, and outputs the generated MR signal data to the processing circuitry 13.

While a situation of the transmitting coil 4 applying an RF magnetic field and the receiving coil 6 receiving MR signals is exemplified here, the embodiment is not limited to this. For example, the transmitting coil 4 may further have a receiving function that receives the MR signals, and the receiving coil 6 may further have a transmitting function that applies the RF magnetic field. When the transmitting coil 4 has the receiving function, the receiving circuitry 7 generates the MR signal data also from the MR signals received by the transmitting coil 4. When the receiving coil 6 has the transmitting function, the transmission circuitry 5 supplies the RF pulse current to the receiving coil 6 also.

The couch 8 includes a couchtop 8a on which the subject S is placed, and inserts the couchtop 8a into the imaging space that is formed on the inner side of the static magnet 1 and the gradient coil 2. For example, the couch 8 is installed such that the longitudinal direction thereof is in parallel with the central axis of the static magnet 1.

The input circuitry 9 receives input operation of various instructions and a variety of information from an operator. For example, the input circuitry 9 is implemented with a trackball, switch buttons, a mouse, a keyboard, and a touch panel. The input circuitry 9 is connected to the processing circuitry 15, and it converts the input operation received from the operator into an electrical signal and outputs it to the processing circuitry 15.

The display 10 displays thereon a variety of information and various images. For example, the display 10 is implemented with a liquid crystal monitor, a cathode ray tube (CRT) monitor, and a touch panel. The display 10 is connected to the processing circuitry 15, and it converts data of a variety of information and of various images sent from the processing circuitry 15 into an electrical signal for display and outputs it.

The memory circuitry 11 stores therein a variety of data. For example, the memory circuitry 11 stores therein the MR signal data and the data of MR images for each subject S. For example, the memory circuitry 11 is implemented with a semiconductor memory device such as a random access memory (RAM) and a flash memory, a hard disk, and an optical disk.

The processing circuitry 12 has a couch control function 12a. For example, the processing circuitry 12 is implemented with a processor. The couch control function 12a is connected to the couch 8 and, by outputting an electrical signal of control to the couch 8, controls the operation of the couch 8. For example, the couch control function 12a receives instructions to move the couchtop 8a in the longitudinal direction, the up-and-down direction, or the left-and-right direction from the operator via the input circuitry 9, and operates a drive mechanism of the couchtop 8a that the couch 8 has so as to move the couchtop 8a in accordance with the received instructions.

The processing circuitry 13 has a sequence control function 13a. For example, the processing circuitry 13 is implemented with a processor. The sequence control function 13a executes various pulse sequences. Specifically, the sequence control function 13a drives the gradient power supply 3, the transmission circuitry 5, and the receiving circuitry 7, based on sequence execution data that is output from the processing circuitry 15, and thereby executes the various pulse sequences.

The sequence execution data is the information that defines a pulse sequence that indicates a procedure to collect MR signal data. Specifically, the sequence execution data is the information that defines the timing of the current that the gradient power supply 3 supplies to the gradient coil 2 and the strength of the supplied current, the strength of RF pulse current that the transmission circuitry 5 supplies to the transmitting coil 4 and the supply timing thereof, the detection timing that the receiving circuitry 7 detects MR signals, and others.

Furthermore, the sequence control function 13a receives MR signal data from the receiving circuitry 7 as the result of having executed the various pulse sequences, and stores the received MR signal data in the memory circuitry 11. The aggregation of the MR signal data received by the sequence control function 13a, by each piece of MR data being arrayed in two-dimension or in three-dimension depending on the positional information given by the read-out gradient magnetic field, the phase-encoding gradient magnetic field, and the slice gradient magnetic field in the foregoing, is stored in the memory circuitry 11 as the data constituting k-space.

The processing circuitry 14 has an image generation function 14a. For example, the processing circuitry 14 is implemented with a processor. The image generation function 14a generates an MR image based on the MR signal data stored in the memory circuitry 11. Specifically, the image generation function 14a reads out the MR signal data stored in the memory circuitry 11 by the sequence control function 13a and generates an MR image by performing post processing, that is, reconstruction processing such as the Fourier transformation, on the read-out MR signal data. Furthermore, the image generation function 14a stores the data of the generated MR image into the memory circuitry 11.

The processing circuitry 15 controls various constituent elements that the MRI apparatus 100 has, and thereby controls a whole of the MRI apparatus 100. For example, the processing circuitry 15 is implemented with a processor. For example, the processing circuitry 15 receives the input of various parameters concerning a pulse sequence from the operator via the input circuitry 9 and, based on the received parameters, generates sequence execution data. The processing circuitry 15 then transmits the generated sequence execution data to the processing circuitry 13, and thereby executes various pulse sequences. Furthermore, the processing circuitry 15 reads out an MR image requested by the operator from the memory circuitry 11, and displays the read-out image on the display 10.

The configuration example of the MRI apparatus 100 in the first embodiment has been explained in the foregoing. With such a configuration, the MRI apparatus 100 has a function of imaging a subject by FSE method. The FSE method is an imaging method that collects a plurality of echo signals referred to as an echo train by applying a plurality of refocusing pulses in sequence after having applied an excitation pulse to a subject. The excitation pulse used in FSE method may be referred to as a flip pulse, and the refocusing pulse may be referred to as a flop pulse. The FSE method may also be referred to as turbo spin echo method.

Figure 2:
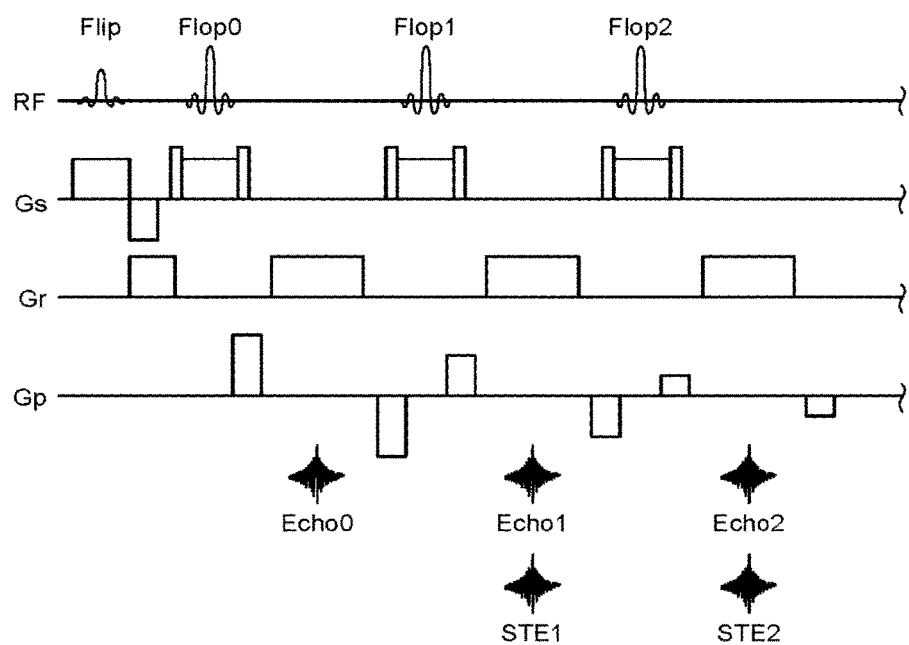
FIG. 2 is a sequence chart illustrating one example of a pulse sequence of FSE method in the first embodiment.

FIG. 2 is a sequence chart illustrating one example of a pulse sequence of FSE method in the first embodiment. In FIG. 2, "RF" indicates the timing that RF pulses are applied. In "Gs," the abscissa axis represents the application timing of the slice gradient magnetic field and the duration of application thereof, and the ordinate axis represents the strength of the slice gradient magnetic field. In "Gr," the abscissa axis represents the application timing of the read-out gradient magnetic field and the duration of application thereof, and the ordinate axis represents the strength of the read-out gradient magnetic field. In "Gp," the abscissa axis represents the application timing of the phase-encoding gradient magnetic field and the duration of application thereof, and the ordinate axis represents the strength of the phase-encoding gradient magnetic field.

For example, as illustrated in FIG. 2, in a pulse sequence of FSE method in the first embodiment, after an excitation pulse (Flip indicated in FIG. 2) is applied, a plurality of refocusing pulses (Flop 0, 1, 2, and so on as indicated in FIG. 2) are consecutively applied. The excitation pulse is a 90° pulse and the refocusing pulses are 180° pulses, for example. By consecutively applying the refocusing pulses in this manner, an echo signal is generated each time the refocusing pulse is applied.

Then, at the timing that the excitation pulse and the refocusing pulses are applied, the slice gradient magnetic field is applied. At the timing immediately after having applied each refocusing pulse, the phase-encoding gradient magnetic field is applied with the strength thereof varying in stages for each refocusing pulse. At the timing that each echo signal is generated, the read-out gradient magnetic field is applied. Consequently, a plurality of echo signals that have been generated by the respective refocusing pulses are detected.

In the echo signal that is generated by the application of refocusing pulse, a spin echo component and a stimulated echo component are included. The stimulated echo component here is an echo component that is generated by RF pulses of three or more.

Normally, not all magnetization can be inverted by a refocusing pulse. Thus, when the refocusing pulse is applied, the magnetization that has been fully inverted and the magnetization that has not been inverted are to be present. The inverted magnetization then results in a spin echo component when re-converged. Meanwhile, the magnetization that has not been inverted is to result in a signal when re-converged after having inverted by a subsequent refocusing pulse. This signal is referred to as a stimulated echo component. Then, by this refocusing pulse also, the magnetization that is fully inverted and the magnetization that is not inverted are generated, and by a further subsequent refocusing pulse, another stimulated component is generated. As just described, due to the incompleteness in the inversion of magnetization by refocusing pulses, the magnetization of another series is generated each time a refocusing pulse is applied. Then, these other series of magnetization are to generate the respective other series of stimulated echo components.

In FIG. 2, a series of spin echo components (Echo 0, 1, 2, and so on as indicated in FIG. 2) and a series of the first generated stimulated echo components (STE 1, 2, and so on) are illustrated, and the depiction of a series of other stimulated echoes is omitted.

In the data collection by FSE method, although there may be a case that all echo signals necessary for generating an image are collected by the excitation pulse of one time, in general, all of the echo signals necessary for generating the image are collected by repeating a plurality of times the data collection with the excitation pulse of one time. The former is referred to as single shot collection and the latter is referred to as multi-shot collection. The shot here is a unit representing the data collection that is performed by the excitation pulse of one time.

Figure 3:
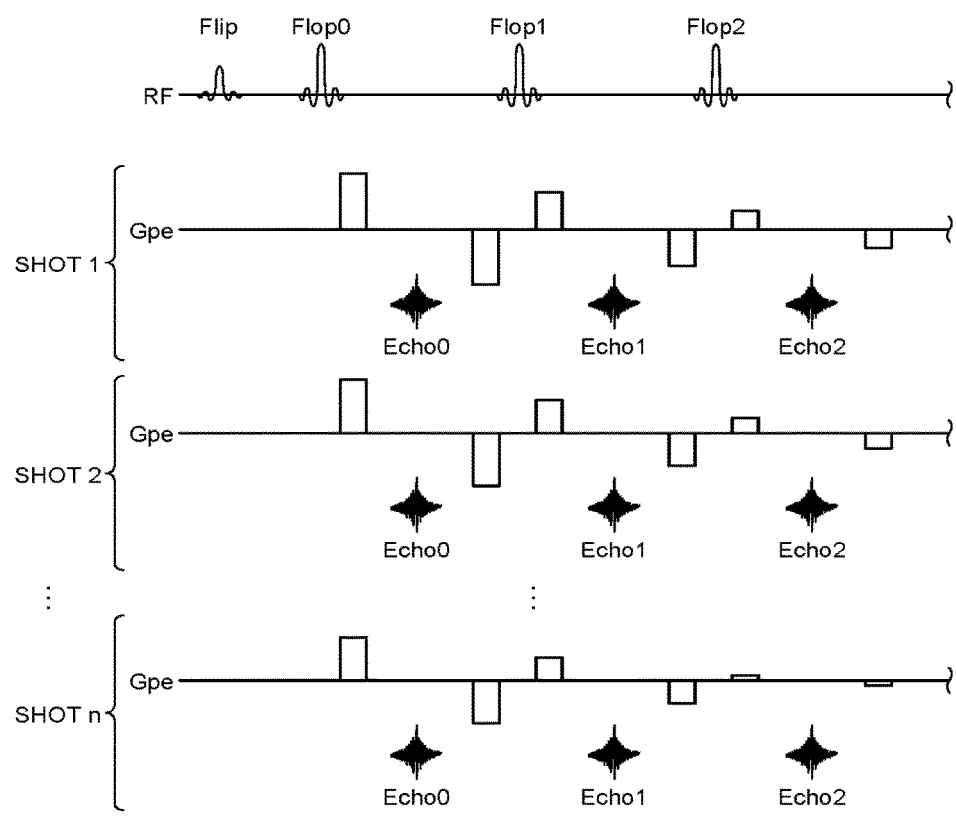
FIG. 3 is a diagram illustrating one example of multi-shot collection in the first embodiment.
Figure 4:
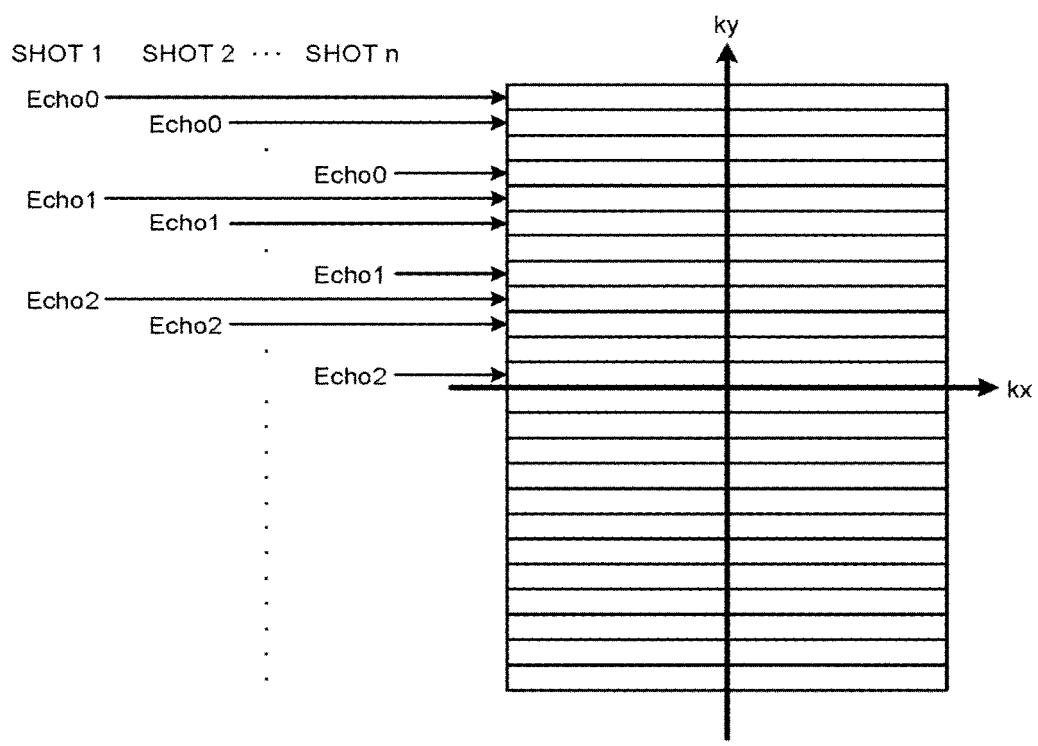
FIG. 4 is a diagram illustrating one example of the multi-shot collection in the first embodiment.

FIGS. 3 and 4 are diagrams illustrating one example of multi-shot collection in the first embodiment. The "RF" indicated in FIG. 3 represents the timing that RF pulses are applied. In the example illustrated in FIG. 3, for the sake of convenience, the RF pulses used for a plurality of shots are indicated in common. The "shot 1" indicated in FIG. 3 represents the phase-encoding gradient magnetic field that is used for the first shot, and echo signals that are collected in that shot. The "shot 2" represents the phase-encoding gradient magnetic field that is used for the second shot, and echo signals that are collected in that shot. The "shot n" represents the phase-encoding gradient magnetic field that is used for the n-th shot, and echo signals that are collected in that shot. While the depiction of the read-out gradient magnetic field and the slice gradient magnetic field is omitted in FIG. 3, the same one is used among the shots in both. FIG. 4 represents the correspondence of the k-space to the echo signals collected by the respective shots illustrated in FIG. 3.

For example, as illustrated in FIG. 3, in the multi-shot collection, a plurality of shots are executed, as in shot 1, 2, . . . , n. At this time, by defining the number of echo signals included in a single echo train as an echo train length (ETL), when the number of lines in the k-space is 256, the number of shots in the multi-shot collection is to be 256/ETL.

Each of phase-encoding gradient magnetic fields applied at the respective shots is set such that the strength thereof is different from one another. As a result of this setting, as illustrated in FIG. 4, a plurality of echo signals (Echo 0, 1, 2, and so on) collected in each shot are to be placed in the k-space at different positions along a ky axis corresponding to the phase-encoding direction, for example.

The order of placing the echo signals collected in each shot in the k-space is not limited to the one that is illustrated in FIG. 4. For example, not as the echo signals collected in each shot being placed alternately along the ky axis as illustrated in FIG. 4, it may be configured such that the echo signals collected in the same shot are placed consecutively along the ky axis. Furthermore, not as the echo signals collected earlier in each shot being placed on the side closer to the outside of the k-space as illustrated in FIG. 4, it may be configured such that the earlier collected echo signals are placed on the side closer to the center of the k-space.

In the FSE method, due to a Maxwell term and a zeroth-order eddy current component that are generated by applying a gradient magnetic field, a zeroth-order phase shift may arise among echo components included in echo signals collected. Such a phase shift in echo components can be, in an MR image generated, a cause of deterioration in image quality, such as reduction in SNR, ghosts, and unevenness in sensitivity.

The Maxwell term is a gradient magnetic field of a high order that is generated by the application of a gradient magnetic field, and is the magnetic field that can be expressed by Maxwell's equations in electromagnetics. In this Maxwell term, in addition to the first order component in the z axis direction necessary for imaging, a higher order component in the z axis direction and unnecessary magnetic fields of the x axis direction and the y axis direction are included. The zeroth-order eddy current component is the zeroth-order component of eddy current that is generated inside the conductors of the MRI apparatus by applying a gradient magnetic field. The Maxwell term and zeroth-order eddy current component can both be a cause of the zeroth-order phase shift in echo signals.

In order to prevent the deterioration in image quality by such a phase shift in echo signals, there is a method that performs a pre-scan for phase correction to measure the phase shift amount that arises in the echo signals and corrects a pulse sequence of a main scan based on the measured phase shift amount, for example. However, in this method, because a pre-scan is executed, the time it takes for imaging the subject becomes long.

Consequently, the MRI apparatus 100 in the first embodiment is configured such that, when the data collection by FSE method is performed, the deterioration in image quality by the zeroth-order phase shift that arises in echo signals can be suppressed without executing a pre-scan for phase correction.

In the following description, of the constituent elements of the MRI apparatus 100 illustrated in FIG. 1, the configuration and function of the memory circuitry 11 and the processing circuitry 15 will be explained in more detail.

The memory circuitry 11 stores therein in advance the zeroth-order phase shift amount per a certain unit concerning the application condition of a gradient magnetic field, on the phase shift that is caused by the application of the gradient magnetic field. The application condition here is the strength of a gradient magnetic field, the duration of application of a gradient magnetic field, and others, for example. The phase shift amount stored in the memory circuitry 11 is referred to by a later-described calculation function 15b of the processing circuitry 15 and is used to calculate the zeroth-order phase shift amount for each echo component. The memory circuitry 11 is one example of memory circuitry specified in claims.

As in the foregoing, in the zeroth-order phase shift that is caused by the application of a gradient magnetic field, there are the one that is due to the Maxwell term and the one that is due to the zeroth-order eddy current component. Consequently, in the first embodiment, the memory circuitry 11 stores therein the zeroth-order phase shift amount that arises due to the Maxwell term and the zeroth-order phase shift amount that arises due to the zeroth-order eddy current component. For example, the respective phase shift amounts are stored in the memory circuitry 11 in a form of look-up table.

FIGS. 5 and 6 are tables illustrating one example of look-up tables of phase shift amount stored in the memory circuitry 11 in the first embodiment. FIG. 5 illustrates one example of a look-up table concerning the zeroth-order phase shift amount caused by the Maxwell term. FIG. 6 illustrates one example of a look-up table concerning the zeroth-order phase shift amount caused by the zeroth-order eddy current component.

For example, as illustrated in FIG. 5, the memory circuitry 11 stores therein the zeroth-order phase shift amount (Mp (°) indicated in FIG. 5) that arises due to the Maxwell term for each channel, on three channels (Ch indicated in FIG. 5) of the x axis, the y axis, and the z axis, when the gradient magnetic field of a unit strength is applied for a unit time along the respective axes.

Furthermore, as illustrated in FIG. 6, the memory circuitry 11 stores therein the zeroth-order phase shift amount (B0p (°) indicated in FIG. 6) that arises due to the zeroth-order eddy current component for each channel, on three channels (Ch indicated in FIG. 6) of the x axis, the y axis, and the z axis, when the gradient magnetic field of a unit strength is applied along the respective axes for a unit time, for example.

In the zeroth-order eddy current component that is caused by the application of a gradient magnetic field, a plurality of components of different time constants may be included.

Consequently, the memory circuitry 11 stores therein the zeroth-order phase shift amount (B0p (°) indicated in FIG. 6) for each channel (Ch indicated in FIG. 6) and for each time constant of the zeroth-order eddy current component (τ (ms) indicated in FIG. 6). For example, in the example illustrated in FIG. 6, on the x axis, 30° that is the phase shift amount by the component of a 100 ms time constant and 10° that is the phase shift amount by the component of a 30 ms time constant are stored.

Each phase shift amount in the foregoing is measured at the time of installation of the MRI apparatus 100, for example, and is stored in the memory circuitry 11. At this time, each phase shift amount can be measured by using a known measurement method. For example, the zeroth-order phase shift that arises due to the Maxwell term is measured by using the measurement method disclosed in JP-A 2014-83388 (KOKAI). The zeroth-order phase shift that arises due to the zeroth-order eddy current component is measured by using the measurement method disclosed in JP-A 2011-182916 (KOKAI).

The processing circuitry 15 includes a setting function 15a, the calculation function 15b, a correcting function 15c, and an execution function 15d. The processing circuitry 15 is one example of processing circuitry specified in claims.

The setting function 15a sets a pulse sequence used in data collection. In the first embodiment, the setting function 15a sets a pulse sequence of the main scan at the time the data collection by FSE method is performed.

For example, the setting function 15a displays on the display 10 a graphical user interface (GUI) to receive the operation of selecting a pulse sequence used for imaging, and the operation of inputting various parameters concerning the selected pulse sequence. The setting function 15a then sets, based on the operation received via the displayed GUI, the pulse sequence used in the data collection. At this time, the setting function 15a generates, based on the received parameters, sequence execution data to execute the set pulse sequence.

The calculation function 15b calculates, based on the pulse sequence used in data collection by FSE method, the zeroth-order phase shift amount on at least one echo component included in each of a plurality of echo signals collected by the pulse sequence.

In the first embodiment, the calculation function 15b calculates the zeroth-order phase shift amount for each echo component included in each of a plurality of echo signals that are collected by the pulse sequence of the main scan set by the setting function 15a. That is, the calculation function 15b calculates the phase shift amount without performing a pre-scan.

Specifically, the calculation function 15b holds, for each echo component, a relational expression that indicates the relation of the zeroth-order phase shift amount at between time points at which each of a plurality of echo signals is generated, and calculates the zeroth-order phase shift amount based on the relational expression for each echo component.

That is, the calculation function 15b calculates the phase shift amount of echo signals collected by FSE method by simulation calculation in which the phase variation of echo components included in the echo signals is modeled.

At this time, the calculation function 15b calculates the phase shift amount by the model in which the spin echo component and the stimulated echo component included in echo signals are distinguished and the time points at which the echo signals are generated are distinguished.

The calculation function 15b further holds a relational expression that indicates the relation of the phase shift amount at between time points at which the echo signals are generated, and calculates the phase shift amount by simulation calculation based on the relational expression.

Figure 7:
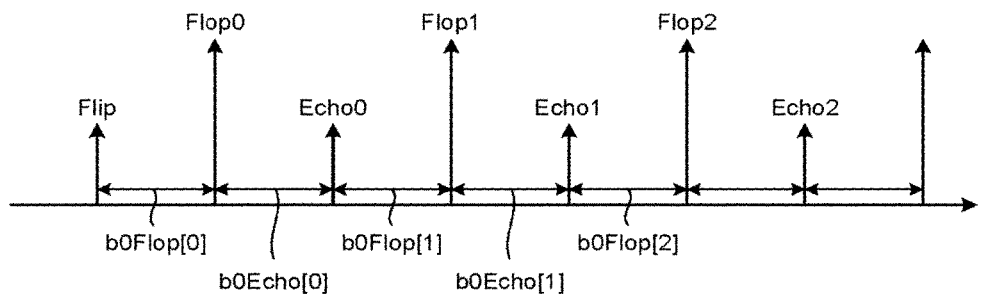
FIG. 7 is a diagram for explaining the calculation of phase shift amount performed by a calculation function in the first embodiment.

FIG. 7 is a diagram for explaining the calculation of phase shift amount performed by the calculation function 15b in the first embodiment. FIG. 7 illustrates the excitation pulse (Flip indicated in FIG. 7) and a plurality of refocusing pulses (Flop 0, 1, 2, and so on as indicated in FIG. 7) illustrated in FIGS. 2 and 3. In the following description, the order of the refocusing pulses and that of the echo signals are counted as 0, 1, 2, and so on (the order of stimulated echo components is as 1, 2, and so on).

For example, as illustrated in FIG. 7, the zeroth-order phase shift amount that arises before the zeroth refocusing pulse (Flop 0 indicated in FIG. 7) is applied after the excitation pulse is applied is defined as b0Flop[0], the zeroth-order phase shift amount that arises before the zeroth echo signal (Echo 0 indicated in FIG. 7) is generated after the zeroth refocusing pulse is applied is defined as b0Echo[0], and the zeroth-order phase shift amount that arises before the first refocusing pulse (Flop 1 indicated in FIG. 7) is applied after the zeroth echo signal is generated is defined as b0Flop[1].

In this case, when the zeroth-order phase shift amount at the time point that the zeroth refocusing pulse is applied is defined as P0TotalFlop[0], the zeroth-order phase shift amount of the spin echo component at the time point that the zeroth echo signal is generated is defined as P0TotalEcho[0], the zeroth-order phase shift amount at the time point that the first refocusing pulse is applied is defined as P0TotalFlop[1], the zeroth-order phase shift amount of the spin echo component at the time point that the first echo signal is generated is defined as P0TotalEcho[1], and the zeroth-order phase shift amount of the stimulated echo component at the time point that the first echo signal is generated is defined as P0TotalSTE[1], the zeroth-order phase shift amounts at the respective time points are expressed by the following expressions.

$P0\text{TotalFlop}[0]=b0\text{Flop}[0]$ $P0\text{TotalEcho}[0]=-P0\text{TotalFlop}[0]+b0\text{Echo}[0]$ $P0\text{TotalFlop}[1]=P0\text{TotalEcho}[0]+b0\text{Flop}[1]$ $P0\text{TotalEcho}[1]=-P0\text{TotalFlop}[1]+b0\text{Echo}[1]$ $P0\text{TotalSTE}[1]=-P0\text{TotalFlop}[0]+b0\text{Echo}[1]$ As in the foregoing, the zeroth-order phase shift amount at each time point is expressed by the accumulation of zeroth-order phase shift amounts that arise before the respective time points after the excitation pulse is applied. That is, when ndx=0, 1, 2, and so on (as for the stimulated echo component, ndx>0) is defined, the zeroth-order phase shift amount at the time point that the ndx-th refocusing pulse is applied is defined as P0TotalFlop[ndx], the zeroth-order phase shift amount of the spin echo component at the time point that the ndx-th echo signal is generated is defined as P0TotalEcho[ndx], and the zeroth-order phase shift amount of the stimulated echo component at the time point that the ndx-th echo signal is generated is defined as P0TotalSTE[ndx], the zeroth-order phase shift amounts at the respective time points are expressed by the following Expression (1) to Expression (3).

$$P0\text{TotalFlop}[ndx]=P0\text{TotalEcho}[ndx-1]+b0\text{Flop}[ndx] \quad (1)$$

$$P0\text{TotalEcho}[ndx]=-P0\text{TotalFlop}[ndx]+b0\text{Echo}[ndx] \quad (2)$$

$$P0\text{TotalSTE}[ndx]=-P0\text{TotalFlop}[ndx-1]+b0\text{Echo}[ndx] \quad (3)$$

For example, the calculation function 15b holds the above-described Expression (1) to Expression (3) and, based on these relational expressions, calculates the zeroth-order phase shift amounts at the time points of the respective echo signals. Specifically, the calculation function 15b, by using the above-described Expression (1) to Expression (3), calculates the zeroth-order phase shift amounts b0Flop[ndx] and b0Echo[ndx] in sequence in order of ndx=0, 1, 2, and so on, and thereby calculates in sequence the zeroth-order phase shift amounts P0TotalFlop[ndx], P0TotalEcho[ndx], and P0TotalSTE[ndx] at the respective time points.

At this time, the calculation function 15b refers to the phase shift amount stored in the memory circuitry 11 and, based on the application condition of gradient magnetic field applied in the pulse sequence used in data collection, calculates the zeroth-order phase shift amount for each echo component.

That is, the calculation function 15b refers to the phase shift amount stored in the memory circuitry 11 and, based on the application condition of gradient magnetic field applied at the time the echo signals are collected, calculates the zeroth-order phase shift amount by simulation calculation.

The calculation function 15b calculates the phase shift amount caused by at least one of the Maxwell term and the zeroth-order eddy current component, which are generated by the gradient magnetic field applied in the pulse sequence, and thereby calculates the zeroth-order phase shift amount. In the first embodiment, the calculation function 15b calculates the phase shift amount caused by both the Maxwell term and the zeroth-order eddy current component and, by adding the respective calculated phase shift amounts, calculates the zeroth-order phase shift amount for each echo component.

Specifically, the calculation function 15b refers to the phase shift amount stored in the memory circuitry 11 and, on three channels of the x axis, the y axis, and the z axis, calculates the zeroth-order phase shift amount caused by the Maxwell term and the zeroth-order eddy current component for each channel. The calculation function 15b then adds the respective calculated phase shift amounts for each channel, and thereby calculates the zeroth-order phase shift amount caused by the Maxwell term that is generated by all of the gradient magnetic fields along the x axis, the y axis, and the z axis.

It has been known that the zeroth-order phase shift caused by the Maxwell term is proportional to the square of the strength of gradient magnetic field. For example, when the strength of gradient magnetic field in the x axis direction is defined as Gx, the duration of application is defined as tx, and the zeroth-order phase shift amount, which arises at the time the gradient magnetic field of a unit strength is applied for a unit time along the x axis direction, is defined as Mpx, the zeroth-order phase shift amount PSmx caused by the Maxwell term that is generated due to the gradient magnetic field in the x axis direction is expressed by the following Expression (4).

$$PSmx = Mpx \times (Gx)^2 \times tx \qquad (4)$$

For example, the calculation function 15b calculates, based on the duration tx of application and the strength Gx of the gradient magnetic field in the x axis direction applied in the pulse sequence, the zeroth-order phase shift amount PSmx caused by the Maxwell term that is generated due to the gradient magnetic field in the x axis direction, by the above-described Expression (4).

At this time, the calculation function 15b refers to the look-up table concerning the zeroth-order phase shift amount caused by the Maxwell term illustrated in FIG. 5, acquires the zeroth-order phase shift amount Mp that is caused by the Maxwell term when the gradient magnetic field of a unit strength is applied for a unit time along the x axis direction, and uses it as Mpx, for example.

The calculation function 15b further calculates, in the same manner, the zeroth-order phase shift amount PSmy caused by the Maxwell term that is generated due to the gradient magnetic field in the y axis direction and the zeroth-order phase shift amount PSmz caused by the Maxwell term that is generated due to the gradient magnetic field in the z axis direction.

The above-described Expression (4) is the expression for the case that the waveform of the gradient magnetic field is represented in a quadrate shape as illustrated in FIG. 2.

However, in the gradient magnetic field, in general, the strength of magnetic field changes gradually at the time of rising and at the time of falling. Considering these changes, the waveform of the gradient magnetic field is to be represented in a shape closer to a trapezoid. Hence, the calculation function 15b may calculate the phase shift amount PSmx by the following Expression (5), for example.

$$PSmx = Mpx \times \int G(t)^2 dtx \qquad (5)$$

By calculating the phase shift amount PSmx by using the above-described Expression (5), it is possible to calculate the zeroth-order phase shift amount that is caused by the Maxwell term more accurately.

Meanwhile, it has been known that the zeroth-order phase shift caused by the zeroth-order eddy current component is proportional to the strength of gradient magnetic field. For example, when the strength of gradient magnetic field in the x axis direction is defined as Gx; the duration of application of the gradient magnetic field is defined as tx; the time constant of the zeroth-order eddy current component, which is generated at the time the gradient magnetic field of a unit strength is applied for a unit time along the x axis direction, is defined as $\tau x1$, $\tau x2$, and so on; and the phase shift amount caused by each zeroth-order eddy current component is defined as B0px1, B0px2, and so on, the zeroth-order phase shift amount PSb0x caused by the zeroth-order eddy current component that is generated due to the gradient magnetic field in the x axis direction is expressed by the following Expression (6).

$$PSb0x = B0px1 \times Gx \times \exp(-tx/\tau x1) + B0px2 \times Gx \times \exp(-tx/\tau x2) + \qquad (6)$$

For example, the calculation function 15b calculates, based on the duration tx of application and the strength Gx of the gradient magnetic field in the x axis direction applied in the pulse sequence, the zeroth-order phase shift amount PSb0x caused by the zeroth-order eddy current component that is generated due to the gradient magnetic field in the x axis direction, by the above-described Expression (6).

At this time, the calculation function 15b refers to the look-up table concerning the zeroth-order phase shift amount caused by the zeroth-order eddy current component illustrated in FIG. 6, and acquires the zeroth-order phase shift amount B0p that is caused by the zeroth-order eddy current component when the gradient magnetic field of a unit strength is applied for a unit time along the x axis direction, for example. At this time, on the x axis, when a plurality of time constants and phase shift amounts different from one another are stored, the calculation function 15b acquires those time constants and phase shift amounts and uses them as $\tau x1$, $\tau x2$, and so on, and as B0px1, B0px2, and so on, respectively.

The calculation function 15b further calculates, in the same manner, the zeroth-order phase shift amount PSb0y caused by the zeroth-order eddy current component that is generated due to the gradient magnetic field in the y axis direction, and the zeroth-order phase shift amount PSb0z caused by the zeroth-order eddy current component that is generated due to the gradient magnetic field in the z axis direction. The calculation function 15b then adds the calculated three phase shift amounts Psb0x, Psb0y, and PSb0z, and thereby calculates the zeroth-order phase shift amount caused by the zeroth-order eddy current component that is generated by all of the gradient magnetic fields along the x axis, the y axis, and the z axis.

The calculation function 15b, when calculating the zeroth-order phase shift amounts b0Flop[ndx] and b0Echo[ndx] in the above-described Expression (1) to Expression (3), calculates the phase shift amounts in the foregoing manner.

At this time, as for the zeroth-order phase shift amount caused by the Maxwell term, the calculation function 15b calculates, based on the duration of application and the strength of all of the gradient magnetic fields applied in a section between the time point ndx−1 and the time point ndx, the phase shift amount caused by the respective gradient magnetic fields by the above-described Expression (4).

Meanwhile, in the zeroth-order eddy current component, because the component for which the time constant is long may be included, it is desirable that the phase shift amount be calculated from a time point temporally retraced to a certain extent and be accumulated. Consequently, as for the phase shift amount caused by the zeroth-order eddy current component, the calculation function 15b calculates and accumulates the phase shift amount by retracing the time five times or more the time constant, not only the section between the time point ndx−1 and the time point ndx, for each channel of the gradient magnetic field, for example.

The reason for the target range of calculating the phase shift amount being defined as five times or more the time constant is that, in general, when the time that is five times or more the time constant elapses, the zeroth-order eddy current component of that time constant disappears completely. That is, by calculating the phase shift amount from the time point retraced five times or more the time constant, all of the phase shift amounts caused at the time point of a calculation target can be calculated. When a plurality of components of different time constants are included in the zeroth-order eddy current component that is caused by the gradient magnetic field of the same channel, for each time constant, the phase shift amount is calculated retracing the time of five times or more the time constant.

The respective relational expressions used by the calculation function 15b in the foregoing are stored in the memory circuitry 11 as a part of a program that implements the calculation function 15b, for example. Alternatively, the relational expressions may be stored as a module invoked from the program that implements the calculation function 15b or may be stored as a table referred to by the program that implements the calculation function 15b.

The correcting function 15c corrects, based on the phase shift amount calculated by the calculation function 15b, the phases of refocusing pulses applied in the pulse sequence such that the phases match at least one of between spin echo components, between stimulated echo components, and between a spin echo component and a stimulated echo component. The "between spin echo components" means "between one spin echo component and another spin echo component." The "between stimulated echo components" means "between one stimulated echo component and another stimulated echo component." In the first embodiment, the correcting function 15c corrects, based on the phase shift amount calculated by the calculation function 15b, the phases of refocusing pulses applied in the pulse sequence of the main scan.

That is, the correcting function 15c corrects, based on the calculated phase shift amount, the phases of refocusing pulses applied in the pulse sequence such that the phases match at each time point at which respective echo signals are generated.

First, the correcting function 15c calculates, based on the phase shift amount calculated by the calculation function 15b, the correction amount for the phase of each refocusing pulse.

For example, in the example illustrated in FIG. 7, when the zeroth-order phase shift amount after correction at the time point that the zeroth refocusing pulse is applied is defined as P0DiffTotalFlop[0], the zeroth-order phase shift amount of a spin echo component after correction at the time point that the zeroth echo signal is generated is defined as P0CorrTotalEcho[0], the zeroth-order phase shift amount after correction at the time point that the first refocusing pulse is applied is defined as P0DiffTotalFlop[1], the zeroth-order phase shift amount of a spin echo component after correction at the time point that the first echo signal is generated is defined as P0CorrTotalEcho[1], and the zeroth-order phase shift amount of a stimulated echo component after correction at the time point that the first echo signal is generated is defined as P0CorrTotalSTE[1], the zeroth-order phase shift amount after correction at each time point is expressed by the following expressions.

$P0\text{DiffTotalFlop}[0]=b0\text{Flop}[0]-ph\text{Corr}[0]$ $P0\text{CorrTotalEcho}[0]=2\times ph\text{Corr}[0]+P0\text{TotalEcho}[0]$ $P0\text{DiffTotalFlop}[1]=2\times ph\text{Corr}[0]-ph\text{Corr}[1]+P0\text{TotalFlop}[1]$ $P0\text{CorrTotalEcho}[1]=2\times ph\text{Corr}[1]-2\times ph\text{Corr}[0]+P0\text{TotalEcho}[1]$ $P0\text{CorrTotalSTE}[1]=2\times ph\text{Corr}[1]+P0\text{TotalSTE}[1]$ That is, when ndx=0, 1, 2, and so on (as for the stimulated echo component, ndx>0) is defined, the correction amount for the phase of the ndx-th refocusing pulse is defined as phCorr[ndx], the zeroth-order phase shift amount of the spin echo component after correction at the time point that the ndx-th echo signal is generated is defined as P0CorrTotalEcho[ndx], and the zeroth-order phase shift amount of the stimulated echo component after correction at the time point that the ndx-th echo signal is generated is defined as P0CorrTotalSTE[ndx], the zeroth-order phase shift amounts after correction at the respective time points are expressed by the following Expression (7) and Expression (8).

$$P0\text{CorrTotalEcho}[ndx]=P0\text{TotalEcho}[ndx]+2\times ph\text{Corr}[ndx]-2\times ph\text{Corr}[ndx-1]+2\times ph\text{Corr}[ndx-2]- \quad (7)$$

$$P0\text{CorrTotalSTE}[ndx]=P0\text{TotalSTE}[ndx]+2\times ph\text{Corr}[ndx]-2\times ph\text{Corr}[ndx-1]- \quad (8)$$

For example, the correcting function 15c holds the above-described Expression (7) and Expression (8) and, based on these relational expressions, calculates the correction amount for the phase of each refocusing pulse.

In the first embodiment, a situation in which the correcting function 15c corrects the phase of each refocusing pulse applied in the pulse sequence such that the phases between the spin echo components match will be exemplified. When the phase correction is performed so that the phases between the spin echo components match, the phase shift amount of the stimulated echo component does not necessarily need to be calculated.

Specifically, the correcting function 15c calculates, on a plurality of spin echo components, the correction amount phCorr[ndx] for the phase of the ndx-th refocusing pulse by the following Expression (9) so that the phases of the successive spin echo components match.

$$ph\text{Corr}[ndx]=\text{Polarity}\times(P0\text{TotalEcho}[ndx]-P0\text{TotalEcho}[ndx+1])/2 \quad (9)$$

The Polarity is assumed to be 1 when the ndx is an even number, and to be −1 when the ndx is an odd number.

The correcting function 15c corrects, after calculating the correction amount phCorr[ndx] as in the foregoing, the phase of the ndx-th refocusing pulse used in the pulse sequence set by the setting function 15a by using the calculated correction amount phCorr[ndx]. At this time, the correcting function 15c modifies, based on the correction amount phCorr[ndx], the definition concerning the ndx-th refocusing pulse included in the sequence execution data generated by the setting function 15a.

The execution function 15d executes the pulse sequence after correction by the correcting function 15c. In the first embodiment, the execution function 15d executes the pulse sequence of the main scan after correction by the correcting function 15c. Specifically, the execution function 15d transmits the sequence execution data that has been modified by the correcting function 15c to the processing circuitry 13, and thereby executes the pulse sequence after correction.

The various processing functions that the above-described processing circuitries 12 to 15 have are stored in the memory circuitry 11 in the form of programs executable by a computer, for example. The processing circuitries 12 to 15 read out the respective programs from the memory circuitry 11 and execute the read-out programs, and thereby implement the processing functions corresponding to the respective programs. In other words, the processing circuitries 12 to 15 in a state of having read out the respective programs are to have the respective processing functions that are illustrated in FIG. 1.

In FIG. 1, described has been the situation in which the processing function of the couch control function 12a is implemented by single processing circuitry 12, the processing function of the sequence control function 13a is implemented by single processing circuitry 13, the processing function of the image generation function 14a is implemented by single processing circuitry 14, and the respective functions of the setting function 15a, the calculation function 15b, the correcting function 15c, and the execution function 15d are implemented by single processing circuitry 15. The embodiment, however, is not limited to this. For example, it does not matter even if the processing circuitries 12 to 15 are configured with a plurality of independent processors in combination and each processor is to implement the respective functions by executing the respective programs. The various processing functions that the processing circuitries 12 to 15 have may be implemented by being distributed or integrated in a single or a plurality of processing circuitries as appropriate.

The term "processor" used in the above description means a central processing unit (CPU), a graphics processing unit (GPU), or a circuit such as an application specific integrated circuit (ASIC) and a programmable logic device (for example, a simple programmable logic device (SPLD), a complex programmable logic device (CPLD), and a field programmable gate array (FPGA)), for example. In place of storing the programs in the memory circuitry 11, it does not matter even if it is configured such that the program is directly incorporated in the circuitry of the processor. In this case, the processor implements the function by reading out and executing the program incorporated in the circuitry. Each processor in the first embodiment is not limited to the case in which it is configured as single circuitry for each processor, and may be configured as a single processor by combining a plurality of independent circuitries so as to implement its function.

Figure 8:
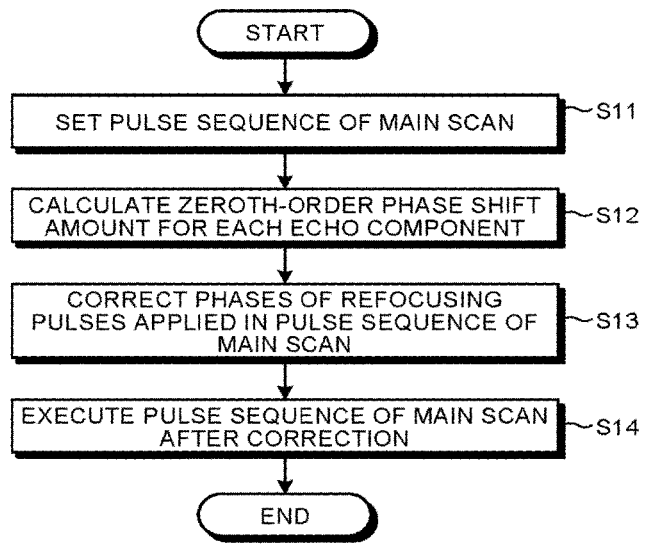
FIG. 8 is a flowchart illustrating a processing procedure of phase correction method performed by the MRI apparatus in the first embodiment.

FIG. 8 is a flowchart illustrating a processing procedure of phase correction method performed by the MRI apparatus 100 in the first embodiment. For example, as illustrated in FIG. 8, in the first embodiment, the setting function 15a sets a pulse sequence of the main scan when data collection by FSE method is performed (Step S11). Step S11 is a step that is implemented by the processing circuitry 15 reading out and executing a certain program corresponding to the setting function 15a from the memory circuitry 11.

Subsequently, the calculation function 15b calculates the zeroth-order phase shift amount for each echo component included in each of a plurality of echo signals that are collected by the pulse sequence of the main scan set by the setting function 15a (Step S12). Step S12 is a step that is implemented by the processing circuitry 15 reading out and executing a certain program corresponding to the calculation function 15b from the memory circuitry 11.

Then, the correcting function 15c corrects, based on the phase shift amount calculated by the calculation function 15b, the phases of the refocusing pulses applied in the pulse sequence of the main scan (Step S13). Step S13 is a step that is implemented by the processing circuitry 15 reading out and executing a certain program corresponding to the correcting function 15c from the memory circuitry 11.

The execution function 15d then executes the pulse sequence of the main scan after the correction by the correcting function 15c (Step S14). Step S14 is a step that is implemented by the processing circuitry 15 reading out and executing a certain program corresponding to the execution function 15d from the memory circuitry 11.

As in the foregoing, in the first embodiment, when the data collection by FSE method is performed, the zeroth-order phase shift amount for each echo component included in each of a plurality of echo signals is calculated based on the pulse sequence of the main scan and, based on the calculated phase shift amount, the phases of the refocusing pulses applied in the pulse sequence of the main scan are corrected. Consequently, according to the first embodiment, when the data collection by FSE method is performed, it is possible to suppress the deterioration in image quality due to the zeroth-order phase shift that arises in echo signals.

Furthermore, according to the first embodiment, when the data collection by FSE method is performed, it is possible to suppress the deterioration in image quality due to the zeroth-order phase shift that arises in echo signals without executing a pre-scan for phase correction. Consequently, as compared with when a pre-scan for phase correction is executed, it is possible to shorten the time it takes for the imaging of the subject.

When multi-shot collection by FSE method is performed, in a method in which the phase correction is performed by executing a pre-scan, the pre-scan is performed, in general, by using a representative shot out of a plurality of shots executed in the main scan, or by using a pulse sequence for which the data collection in the phase encoding direction has been thinned out. Meanwhile, according to the first embodiment, because the phase correction can be performed without executing a pre-scan, the phase correction can be performed for each shot of different data collection in the phase encoding direction, and thus it is possible to perform the phase correction more accurately as compared with when the pre-scan is used.

First Modification of First Embodiment

In the above-described first embodiment, exemplified has been the situation in which the correcting function 15c corrects the phase of each refocusing pulse such that the phases between the spin echo components match. The embodiment, however, is not limited to this.

For example, the correcting function 15c may correct the phase of each refocusing pulse such that the phases match between a spin echo component and a stimulated echo component.

In this case, the correcting function 15c calculates the correction amount phCorr[ndx] for the phase of the ndx-th refocusing pulse by the following Expression (10) so that the phases match between the spin echo component and the stimulated echo component of the same time point.

$$phCorr[ndx] = Polarity \times (P0TotalEcho[ndx] - P0TotalSTE[ndx])/2 \quad (10)$$

The Polarity is assumed to be 1 when the ndx is an even number, and to be −1 when the ndx is an odd number.

Second Modification of First Embodiment

The correcting function 15c may further correct the phase of each refocusing pulse such that the phases match between stimulated echo components, for example.

In this case, the correcting function 15c calculates the correction amount phCorr[ndx] for the phase of the ndx-th refocusing pulse by the following Expression (11) so that the phases of the respective stimulated echo components match. When the phase correction is performed so that the phases match between the stimulated echo components, the phase shift amount of the spin echo component does not necessarily need to be calculated.

$$phCorr[ndx] = Polarity \times (P0TotalSTE[ndx] - P0TotalSTE[ndx+1])/2 \quad (11)$$

The Polarity is assumed to be 1 when the ndx is an even number, and to be −1 when the ndx is an odd number.

Third Modification of First Embodiment

In the above-described first embodiment, the situation in which the correcting function 15c corrects the phases of refocusing pulses has been exemplified. The embodiment, however, is not limited to this. For example, in addition to the correction of the phase of the refocusing pulse, the correcting function 15c may further correct a reception phase when the echo signals are sampled.

For example, when the phases between the stimulated echo components are made to match, the correcting function 15c corrects the reception phase corresponding to the pulse sequence set by the setting function 15a, by setting to the reception phase the phase of the spin echo component after having corrected the phases of the refocusing pulses.

For example, when the reception phase of each echo signal is defined as rxCorrPh[ndx], the correcting function 15c defines that rxCorrPh[ndx]=P0CorrTotalEcho[ndx].

As just described, by further correcting the reception phase in addition to the phase correction of refocusing pulses, even when the phases of all of the spin echo components cannot be aligned completely by the phase correction of refocusing pulses alone, the phases can be aligned more accurately.

Furthermore, when the phases between the stimulated echo components are made to match, the correcting function 15c may set to the reception phase the phase of the stimulated echo component after having corrected the phases of refocusing pulses, for example. In that case, the correcting function 15c defines that rxCorrPh[ndx]=P0CorrTotalSTE[ndx]. Consequently, even when the phases of all of the stimulated echo components cannot be aligned completely by the phase correction of refocusing pulses alone, the phases can be aligned more accurately.

When the phases between a spin echo component and a stimulated echo component are made to match, the correcting function 15c may set to the reception phase the phase of the spin echo component or the stimulated echo component after having corrected the phases of refocusing pulses, for example. Consequently, the phases of all of the spin echo components or the phases of all of the stimulated echo components can be aligned.

Fourth Modification of First Embodiment

In the above-described first embodiment, exemplified has been the situation in which the correcting function 15c calculates, on a plurality of spin echo components, the correction amount for the phases of refocusing pulses such that the phases of the successive spin echo components match. The embodiment, however, is not limited to this. For example, the correcting function 15c may calculate, based on the phase shift amount of the spin echo component placed near the center of the k-space out of the phase shift amount calculated by the calculation function 15b, the correction amount for the phase of a refocusing pulse applied immediately before that spin echo and, by using in common the calculated correction amount, correct the respective phases of a plurality of refocusing pulses applied in the pulse sequence.

In this case, when the value obtained by dividing TE (also referred to as effective TE) corresponding to near the center of the k-space by echo space (ESP) is defined as TEecho, the calculation function 15b calculates the correction amount phCorr[ndx] for the phase of the ndx-th refocusing pulse by the following Expression (12) or Expression (13).

Note that Expression (12) is used when the phases between spin echo components are made to match. Expression (13) is used when the phases between a spin echo component and a stimulated echo component are made to match. Furthermore, Expression (14) is used when the phases between stimulated echo components are made to match.

$$phCorr[ndx]=\text{Polarity}\times(P0\text{TotalEcho}[TE\text{echo}-1]-P0\text{TotalEcho}[TE\text{echo}])/2 \quad (12)$$

$$phCorr[ndx]=\text{Polarity}\times(P0\text{TotalEcho}[TE\text{echo}]-P0\text{TotalSTE}[TE\text{echo}])/2 \quad (13)$$

$$phCorr[ndx]=\text{Polarity}\times(P0\text{TotalSTE}[TE\text{echo}-1]-P0\text{TotalSTE}[TE\text{echo}])/2 \quad (14)$$

Second Embodiment

In the above-described first embodiment, exemplified has been the situation in which the correcting function 15c corrects the phases of refocusing pulses applied in the pulse sequence of the main scan without executing a pre-scan for phase correction. The embodiment, however, is not limited to this. For example, the phase correction described in the first embodiment may be applied to the pre-scan for phase correction.

While the configuration of an MRI apparatus according to a second embodiment is basically the same as that of the MRI apparatus 100 illustrated in FIG. 1, parts of the setting function 15a, the calculation function 15b, the correcting function 15c, and the execution function 15d that the processing circuitry 15 has are different. In the following description, these functions will be explained with a focus on the points different from those of the first embodiment.

For example, in the second embodiment, the calculation function 15b calculates, based on a pulse sequence used in a pre-scan for phase correction that is executed before a main scan, the zeroth-order phase shift amount for each echo component included in each of a plurality of echo signals that are collected by that pulse sequence. The method that the calculation function 15b calculates the phase shift amount is the same as the one that has been described in the first embodiment.

Furthermore, in the second embodiment, the correcting function 15c corrects, based on the phase shift amount calculated by the calculation function 15b, the phases of refocusing pulses applied in the pulse sequence used in the pre-scan. The method that the correcting function 15c corrects the phases of the refocusing pulses is the same as the one that has been described in the first embodiment.

In the second embodiment, after the pre-scan is executed by using the pulse sequence after correction by the correcting function 15c, the execution function 15d executes the main scan by using the pulse sequence after having performed the phase correction based on the data collected by the pre-scan. The method that the execution function 15d executes the main scan by using the pulse sequence after correcting is the same as the one that has been described in the first embodiment.

In the second embodiment, as for the method of setting a pulse sequence of pre-scan and the method of performing phase correction of a pulse sequence of the main scan based on the data collected by the pre-scan, various known phase correction methods using pre-scan can be used. The phase correction method in the second embodiment, however, is different from the known phase correction method in terms of calculating, before executing a pulse sequence of pre-scan, the phase shift amount for each echo component based on the pulse sequence, and correcting the pulse sequence of pre-scan based on the result of that.

Figure 9:
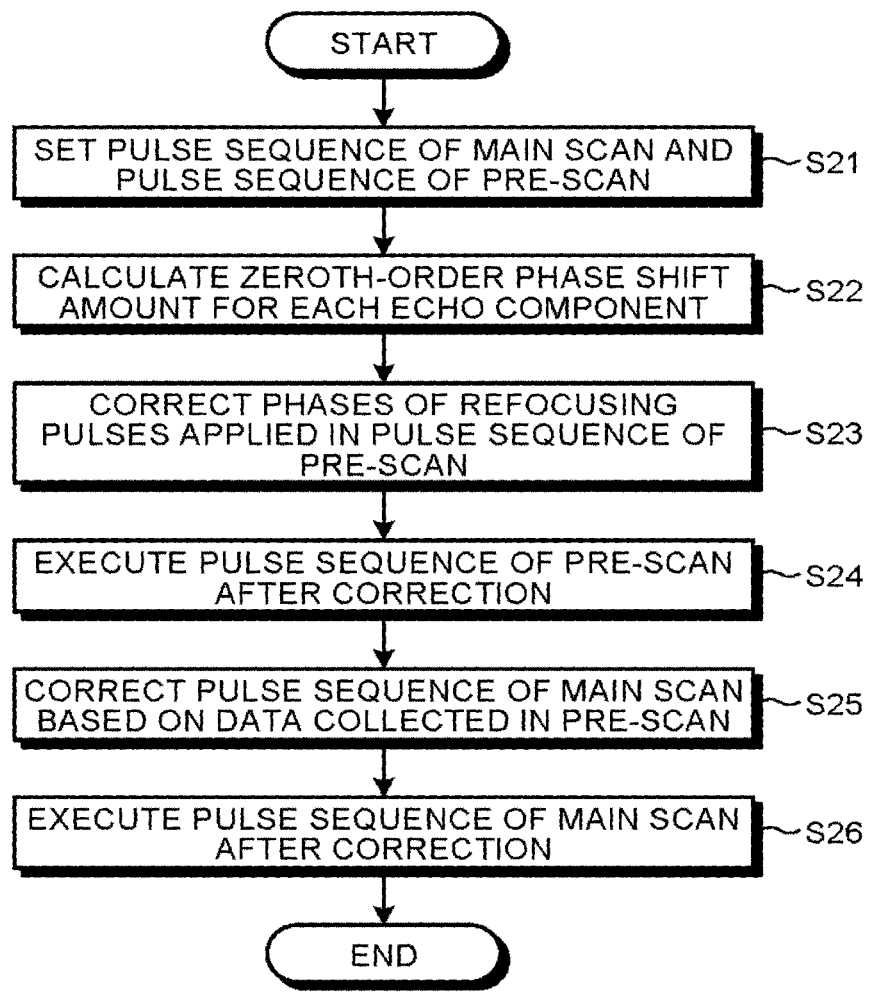
FIG. 9 is a flowchart illustrating a processing procedure of phase correction method performed by an MRI apparatus according to a second embodiment.

FIG. 9 is a flowchart illustrating a processing procedure of the phase correction method performed by the MRI apparatus 100 in the second embodiment. For example, as illustrated in FIG. 9, in the second embodiment, the setting function 15a sets a pulse sequence of the main scan and a pulse sequence of pre-scan when data collection by FSE method is performed (Step S21). Step S21 is a step that is implemented by the processing circuitry 15 reading out and executing certain program corresponding to the setting function 15a from the memory circuitry 11.

Subsequently, the calculation function 15b calculates the zeroth-order phase shift amount for each echo component included in each of a plurality of echo signals collected by the pulse sequence of pre-scan set by the setting function 15a (Step S22). Step S22 is a step that is implemented by the processing circuitry 15 reading out and executing a certain program corresponding to the calculation function 15b from the memory circuitry 11.

Then, the correcting function 15c corrects, based on the phase shift amount calculated by the calculation function 15b, the phases of refocusing pulses applied in the pulse sequence of pre-scan (Step S23). Step S23 is a step that is implemented by the processing circuitry 15 reading out and executing a certain program corresponding to the correcting function 15c from the memory circuitry 11.

The execution function 15d then executes the pulse sequence of pre-scan after the correction by the correcting function 15c (Step S24). Step S24 is a step that is implemented by the processing circuitry 15 reading out and executing a certain program corresponding to the execution function 15d from the memory circuitry 11.

The correcting function 15c then corrects, based on the data collected by the pre-scan, the pulse sequence of the main scan (Step S25). Step S25 is a step that is implemented by the processing circuitry 15 reading out and executing a certain program corresponding to the correcting function 15c from the memory circuitry 11.

Then, the execution function 15d executes the pulse sequence of the main scan after the correction by the correcting function 15c (Step S26). Step S26 is a step that is implemented by the processing circuitry 15 reading out and executing a certain program corresponding to the execution function 15d from the memory circuitry 11.

As in the foregoing, in the second embodiment, when data collection by FSE method is performed, the zeroth-order phase shift amount for each echo component included in each of a plurality of echo signals is calculated based on the pulse sequence used in the pre-scan for phase correction.

Furthermore, based on the calculated phase shift amount, the phases of refocusing pulses applied in the pulse sequence of pre-scan is corrected. Then, based on the data collected in the pre-scan, the pulse sequence of the main scan is corrected. Consequently, according to the second embodiment, when the data collection by FSE method is performed, it is possible to suppress the deterioration in image quality due to the zeroth-order phase shift that arises in echo signals.

Furthermore, when the phase shift amount is calculated based on the phase shift amount measured at the time of installing the MRI apparatus 100 as explained in the first embodiment, there can be a case in which the measured phase shift amount is varied due to factors that change with time, for example. Even in such a case, according to the second embodiment, because the pulse sequence of the main scan is further corrected based on the data collected by the pre-scan using the pulse sequence after correction, it is possible to perform the phase correction more accurately.

Modification of First and Second Embodiments

In the above-described first and second embodiments, exemplified has been the situation of suppressing the deterioration in image quality due to the zeroth-order phase shift.

The embodiment, however, is not limited to this. For example, the phase correction may be performed by further taking into consideration the first or higher order phase shift, such as the first order phase shift and the second order phase shift, which varies depending on the spatial position.

In this case, the calculation function 15b calculates the phase shift amount for each echo component depending on the spatial position of an imaging area in which echo signals are collected, for example. As explained in the first embodiment, when correcting the phases of the refocusing pulses that are applied in the pulse sequence of the main scan, the calculation function 15b calculates the phase shift amount depending on the position of the imaging area in the main scan, for example. Furthermore, as explained in the second embodiment, when correcting the phases of the refocusing pulses that are applied in the pulse sequence of pre-scan, the calculation function 15b calculates the phase shift amount depending on the position of the imaging area in the pre-scan, for example.

More specifically, for each position on a plurality of positions in the imaging space formed on the inner circumferential side of the static magnet 1, the memory circuitry 11 stores therein a look-up table concerning the zeroth-order phase shift amount due to the Maxwell term (for example, see FIG. 5) and a look-up table concerning the zeroth-order phase shift amount due to the zeroth-order eddy current component (for example, see FIG. 6), for example. With the center of the magnetic field defined as zero, for example, the memory circuitry 11 stores therein the respective look-up tables for each spatial position represented by the coordinate (x, y, z) of the device coordinates.

The calculation function 15b then, based on the position of the imaging area that is set together with the pulse sequence by the setting function 15a, identifies the look-up table corresponding to the imaging area and, by referring to the identified look-up table, calculates the phase shift amount for each echo component. The method of calculating the phase shift amount for each echo component by using the look-up table is the same as the one that has been explained in the above-described first embodiment.

Figure 10:
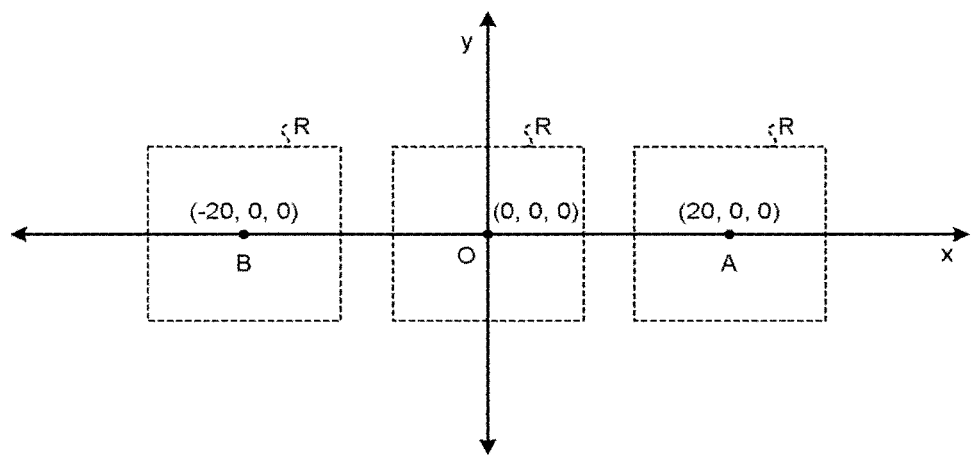
FIG. 10 is a diagram illustrating one example of the calculation of phase shift amount according to a modification of the first and the second embodiments.

FIG. 10 is a diagram illustrating one example of the calculation of phase shift amount according to the modification of the first and the second embodiments. For example, as illustrated in FIG. 10, when the position of the center of an imaging area R is located at the position of the magnetic field center O (0, 0, 0), the calculation function 15b identifies, out of the look-up tables stored in the memory circuitry 11, the look-up table that corresponds to the coordinate (0, 0, 0). When the center of the imaging area R is located at the position A (20 (cm), 0, 0) displaced in the positive direction of the x axis from the magnetic field center O, the calculation function 15b identifies the look-up table corresponding to the coordinate (20, 0, 0), for example.

When the center of the imaging area R is located at the position B (−20 (cm), 0, 0) displaced in the negative direction of the x axis from the magnetic field center O, the calculation function 15b identifies the look-up table corresponding to the coordinate (−20, 0, 0), for example.

The situation in which the position of the imaging area R is displaced along the x axis direction from the magnetic field center O has been exemplified here. However, even when the imaging area is displaced in the y axis direction from the magnetic field center O, is displaced in the z axis direction, or is displaced in two or three axes directions, the calculation function 15b identifies an appropriate look-up table in the same manner.

The processing performed by the correcting function 15c and that by the execution function 15d are the same as the processing that has been explained in the first or the second embodiment.

As just described, by calculating the phase shift amount depending on the spatial position of the imaging area, it is possible to perform the phase correction by taking into consideration not only the zeroth-order phase shift but also the first or higher order phase shift.

According to at least one of the embodiments that have been explained in the foregoing, it is possible to suppress the deterioration in image quality due to the phase shift that arises in echo signals when data collection by FSE method is performed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising: processing circuitry configured to
    calculate, based on a pulse sequence used in data collection by a fast spin echo method, a phase shift amount on at least one echo component included in each of a plurality of echo signals collected by the pulse sequence by accumulating a first phase shift amount at each time point that a refocusing pulse is applied and a second phase shift amount at each time point that a spin echo signal is generated;
    correct, based on the calculated phase shift amount, phases of refocusing pulses applied in the pulse sequence such that phases match at least one of between spin echo components, between stimulated echo components, and between a spin echo component and a stimulated echo component; and
    execute the pulse sequence in which the refocusing pulses of the corrected phases are applied.

2. The magnetic resonance imaging apparatus according to claim 1, further comprising:
    a memory to store therein, in advance, a phase shift amount per a certain unit concerning an application condition of a gradient magnetic field, on a phase shift that arises by application of the gradient magnetic field, wherein
    the processing circuitry is further configured to refer to the stored phase shift amount, and calculate the phase shift amount for each echo component based on the application condition of a gradient magnetic field applied in the pulse sequence used in the data collection.

3. The magnetic resonance imaging apparatus according to claim 1, wherein the processing circuitry is further configured to hold, for each echo component, a relational expression that indicates a relation of phase shift amount between time points at which each of the echo signals is generated, and calculate a phase shift amount for each echo component based on the relational expression.

4. The magnetic resonance imaging apparatus according to claim 1, wherein the processing circuitry is further configured to correct a reception phase when the echo signals are sampled.

5. The magnetic resonance imaging apparatus according to claim 1, wherein the processing circuitry is further configured to calculate, based on a phase shift amount of a spin echo component placed near a center of k-space out of calculated phase shift amounts, a correction amount for a phase of a refocusing pulse applied immediately before that spin echo component and, by using in common the calculated correction amount, correct the phase of each of a plurality of refocusing pulses applied in the pulse sequence.

6. The magnetic resonance imaging apparatus according to, claim 1, wherein the processing circuitry is further configured to:
    calculate, based on a pulse sequence used in a pre-scan for phase correction that is executed before a main scan, a phase shift amount on at least one echo component included in each of a plurality of echo signals collected by the pulse sequence;
    correct, based on the calculated phase shift amount, phases of refocusing pulses applied in the pulse sequence used in the pre-scan; and
    execute the pre-scan by using the pulse sequence in which the refocusing pulses of the corrected phases are applied, and then execute the main scan by using the pulse sequence to which the phase correction has been applied, based on data collected by the pre-scan.

7. The magnetic resonance imaging apparatus according to claim 1, wherein the processing circuitry is further configured to calculate the phase shift amount by calculating a phase shift amount caused by at least one of a Maxwell term and an eddy current component that are generated by a gradient magnetic field applied in the pulse sequence.

8. The magnetic resonance imaging apparatus according to claim 1, wherein the processing circuitry is further configured to calculate the phase shift amount by a simulation calculation in which a phase variation of an echo component included in an echo signal is modeled.

9. The magnetic resonance imaging apparatus according to claim 8, wherein the processing circuitry is further configured to calculate the phase shift amount by the modeling in which a spin echo component and .a stimulated echo component included in an echo signal are distinguished and time points at which the echo signals are generated are distinguished.

10. The magnetic resonance imaging apparatus according to claim 1, wherein the processing circuitry is further configured to calculate the phase shift amount without executing a pre-scan.

11. A magnetic resonance imaging apparatus, comprising: processing circuitry configured to
    calculate a phase shift amount of each of a plurality of echo signals collected by a fast spin echo method by accumulating a first phase shift amount at each time point that a refocusing pulse is applied and a second phase shift amount at each time point that a spin echo signal is generated, by simulation calculation in which a phase variation of an echo component included in the echo signal is modeled;
    correct, based on the calculated phase shift amount, phases of refocusing pulses applied in a pulse sequence such that the phases match at each time point at which the respective echo signals are generated; and execute the pulse sequence in which the refocusing pulses of the corrected phases are applied.

12. The magnetic resonance imaging apparatus according to claim 11, wherein the processing circuitry is further configured to calculate the phase shift amount by the modeling in which a spin echo component and a stimulated echo component included in an echo signal are distinguished, and time points at which the echo signals are generated are distinguished.

13. The magnetic resonance imaging apparatus according to claim 11, wherein the processing circuitry is further configured to calculate the phase shift amount without executing a pre-scan.

14. The magnetic resonance imaging apparatus according to claim 11, further comprising:
a memory to store therein, in advance, a phase shift amount per a certain unit concerning an application condition of a gradient magnetic field, on a phase shift that arises by application of the gradient magnetic field, wherein
the processing circuitry is further configured to refer to the stored phase shift amount and, based on the application condition of a gradient magnetic field applied when the echo signals are collected, calculate the phase shift amount by the simulation calculation.

15. The magnetic resonance imaging apparatus according to claim 11, wherein the processing circuitry is further configured to hold a relational expression that indicates a relation of phase shift amount between time points at which the echo signals are generated, and calculate the phase shift amount by the simulation calculation based on the relational expression.

16. The magnetic resonance imagine apparatus according to claim 11, wherein the processing circuitry is further configured to correct a reception phase when the echo signals are sampled.

17. The magnetic resonance imaging apparatus according to claim 11, wherein the processing circuitry is further configured to calculate based on a phase shift amount of a spin echo component placed near a center of k-space out of calculated phase shift amounts, a correction amount for a phase of a refocusing pulse applied immediately before that spin echo component and, by using in common the calculated correction amount, correct the phase of each of a plurality of refocusing pulses applied in the pulse sequence.

18. The magnetic resonance imaging apparatus according to claim 11, wherein the processing circuitry is further configured to:
calculate, based on a pulse sequence used in a pre-scan for phase correction that is executed before a main scan, a phase shift amount of echo signals collected by the pulse sequence;
correct, based on the calculated phase shift amount, phases of refocusing pulses applied in the pulse sequence used in the pre-scan; and
execute the pre-scan by using the pulse sequence in which the refocusing pulses of the corrected phases are applied, and then execute the main scan by using the pulse sequence to which the phase correction has been applied, based on data collected by the pre-scan.

19. The magnetic resonance imaging apparatus according to claim 11, wherein the processing circuitry is further configured to calculate the phase shift amount by calculating a phase shift amount caused by at least one of a Maxwell term and an eddy current component that are generated by a gradient magnetic field applied in the pulse sequence.

20. A magnetic resonance imaging method, comprising:
calculating, based on a pulse sequence used in data collection by a fast spin echo method, a phase shift amount on at least one echo component included in each of a plurality of echo signals collected by the pulse sequence by accumulating a first phase shift amount at each time point that a refocusing pulse is applied and a second phase shift amount at each time point that a spin echo signal is generated;
correcting, based on the calculated phase shift amount, phases of refocusing pulses applied in the pulse sequence such that phases match at least one of between spin echo components, between stimulated echo components, and between a spin echo component and a stimulated echo component; and
executing the pulse sequence in which the refocusing pulses of the corrected phases are applied.

* * * * *